US006109933A

United States Patent [19]

Lenoir et al.

[11] Patent Number: 6,109,933

[45] Date of Patent: Aug. 29, 2000

[54] CONNECTOR FOR PRINTED CIRCUIT BOARDS

[75] Inventors: Michel Lenoir, Montfort le Gesnois; Jacky Thenaisie; Michel Fonteneau, both of Le Mans, all of France

[73] Assignee: Framatome Connectors International, Courbevoie, France

[21] Appl. No.: 09/108,632

[22] Filed: Jul. 1, 1998

[30] Foreign Application Priority Data

Jul. 8, 1997 [FR] France ..................................... 97 08834

[51] Int. Cl.$^{7}$ ..................................................... H05K 1/00

[52] U.S. Cl. .............................................. 439/79; 439/943

[58] Field of Search .............................. 439/79, 89, 101, 439/943

[56] References Cited

U.S. PATENT DOCUMENTS

| | | | |
|---|---|---|---|
| 4,867,690 | 9/1989 | Thumma | 439/79 |
| 4,869,677 | 9/1989 | Johnson et al. | 439/79 |
| 5,490,787 | 2/1996 | Bowman et al. | 439/79 |
| 5,507,655 | 4/1996 | Goerlich | 439/79 |
| 5,639,249 | 6/1997 | Lenoir | 439/79 |

FOREIGN PATENT DOCUMENTS

| | | |
|---|---|---|
| 0335160 A2 | 10/1989 | European Pat. Off. . |
| 0446980 A1 | 9/1991 | European Pat. Off. . |
| 0486298 A1 | 5/1992 | European Pat. Off. . |
| 0645856 A1 | 3/1995 | European Pat. Off. . |
| 3925958 C1 | 2/1991 | Germany . |

OTHER PUBLICATIONS

French Search Report, Mar. 10, 1998.

*Primary Examiner*—Brian Sircus
*Assistant Examiner*—J. I. Duverne
*Attorney, Agent, or Firm*—Perman & Green, LLP

[57] ABSTRACT

A connector for printed circuit boards comprises a housing of insulating material and a plurality of signal and ground contacts regularly arranged in rows and columns. At least a plurality of said contacts are provided with press-fit terminations for connection to the printed circuit board. The housing is provided with shoulders, each of the shoulders cooperating with a rear section of a contact having a press-fit termination. Each shoulder engages a rear section at a location aligned with the corresponding press-fit termination.

19 Claims, 13 Drawing Sheets

CONNECTOR FOR PRINTED CIRCUIT BOARDS

The invention relates to a high density connector for printed circuit boards, comprising a housing of insulating material and a plurality of male signal and ground contacts regularly arranged in rows and columns, wherein at least a plurality of said contacts are provided with press-fit terminations for connection to the printed circuit board.

Various connectors of this type are known. In the known connector the contacts having press-fit terminations could be deformed during insertion of the press-fit terminations into the corresponding through-holes of the printed circuit board, especially in connectors with a high contact density in view of the small dimensions of the contacts.

The invention aims to provide an improved connector of the above-mentioned type with a high density of the contacts.

According to the invention the connector is characterized in that the housing is provided with shoulders, each of the shoulders cooperating with a rear section of a contact having a press-fit termination, wherein each shoulder engages a rear section at a location aligned with the corresponding press-fit termination.

In this manner a connector with a high density of contacts can be obtained, wherein deformation of the contacts is prevented as the shoulders receive the forces occurring during insertion of the press-fit terminations into the through-holes of the printed circuit board.

The invention will be further explained by reference to the drawings in which some embodiments of the connector assembly according to the invention are shown.

Figure 18:
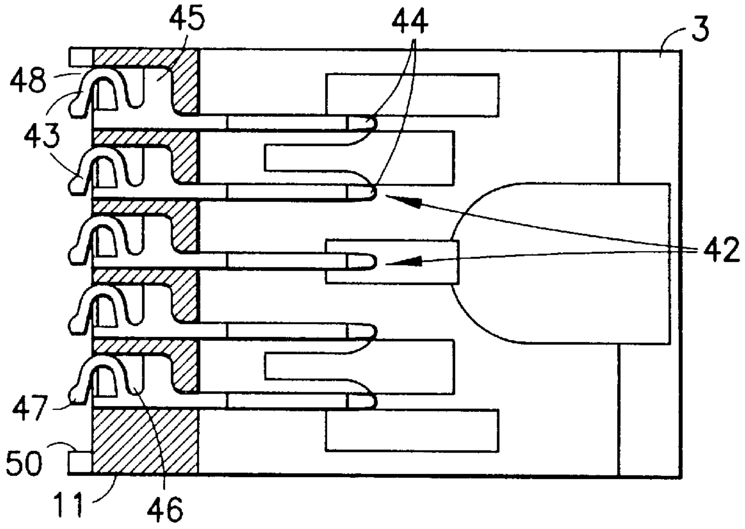
FIG. 18 shows a section through a row of signal contacts of a male connector, showing a first embodiment of male pressure mount contacts.
Figure 19:
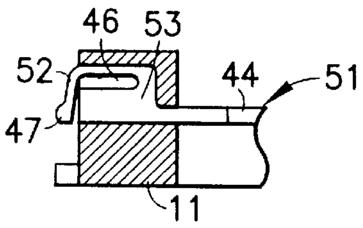

FIG. 19 partially shows a section corresponding to FIG. 18 showing a second embodiment of a pressure mount male contact.

Figure 12:
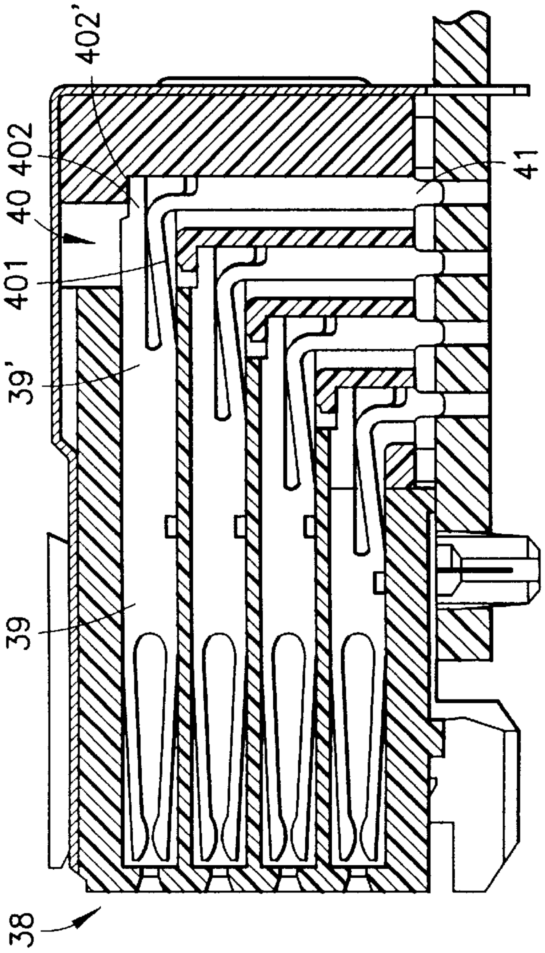
FIG. 12 shows a cross-section through a column of signal contacts of a fourth embodiment of the female connector.
Figure 20A:
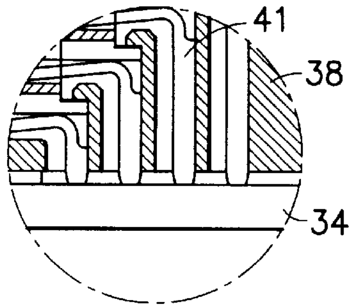
Figure 20B:
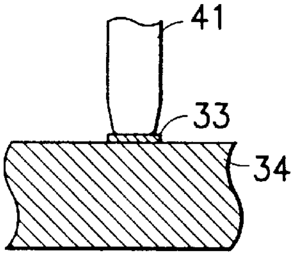
Figure 20C:
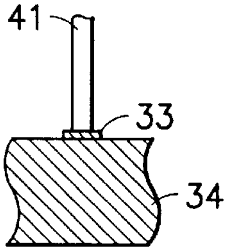

FIGS. 20A–20C show in detail the connection of the signal contacts of the female connector of FIG. 12 to a printed circuit board.

Figure 21A:
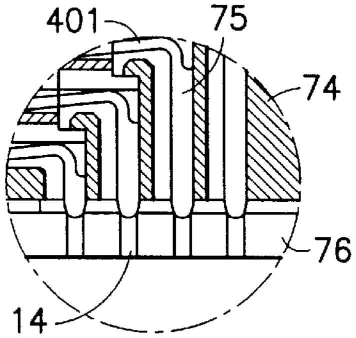
Figure 21B:
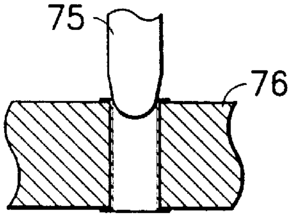
Figure 21C:
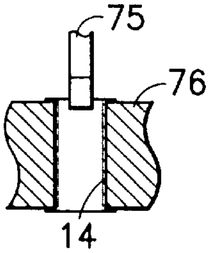

FIGS. 21A–21C show in detail the connection of the signal contacts of a further embodiment of the female connector to a printed circuit board.

Referring to FIGS. 1–4 there is shown a first embodiment of a connector assembly for printed circuit boards, comprising a first or male connector 1 and a second or female connector 2. The male connector 1 comprises a first housing 3 of insulating material and a plurality of male signal contacts 4 and a plurality of male ground contacts 5. In the embodiment shown the length of the ground contacts 5 is greater than the length of the signal contacts 4. However the signal and ground contacts may have equal lengths.

The female connector 2 comprises a second housing 6 of insulating material which is an assembly of a front housing 7 and a rear housing 8. Further the female connector 2 comprises a plurality of female signal contacts 9 and a plurality of female ground contacts 10.

Figure 2:
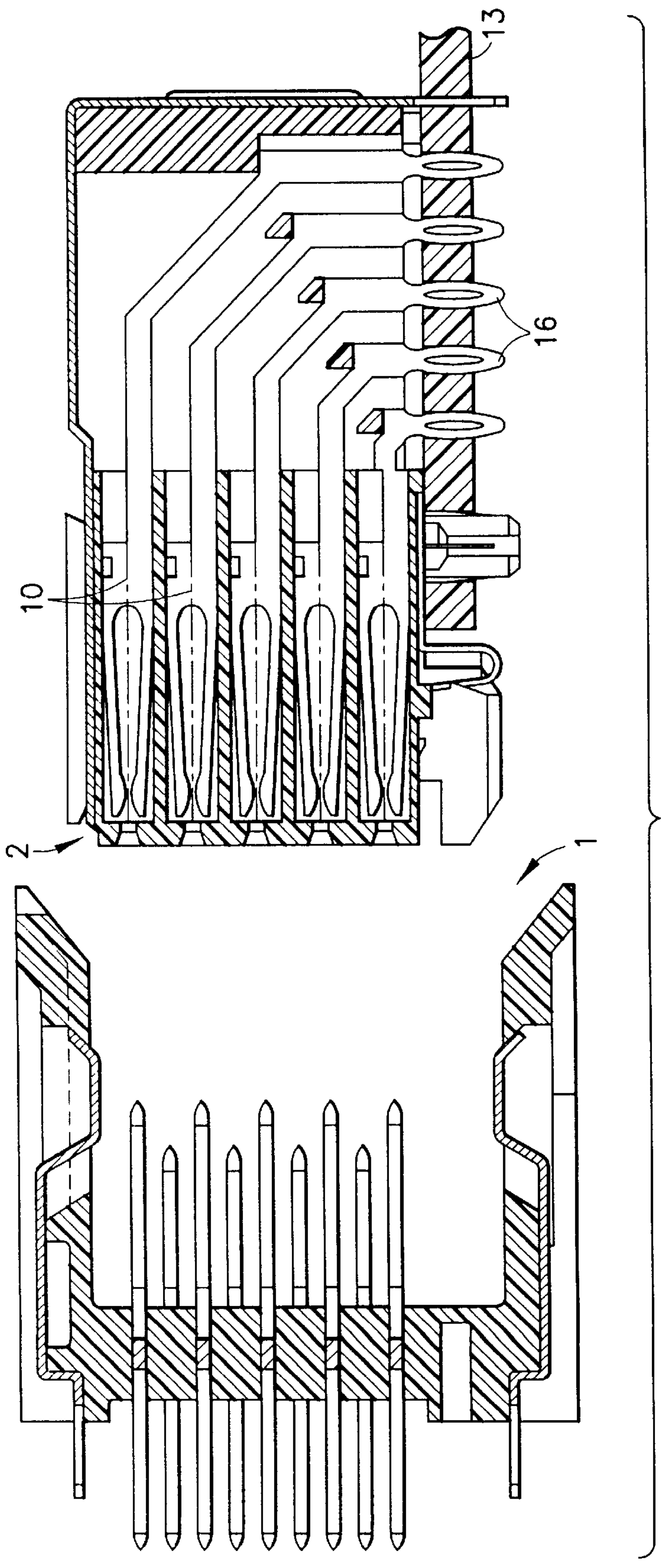
FIG. 2 shows a cross-section through a column of ground contacts of the connector assembly according to FIG. 1.
Figure 3:
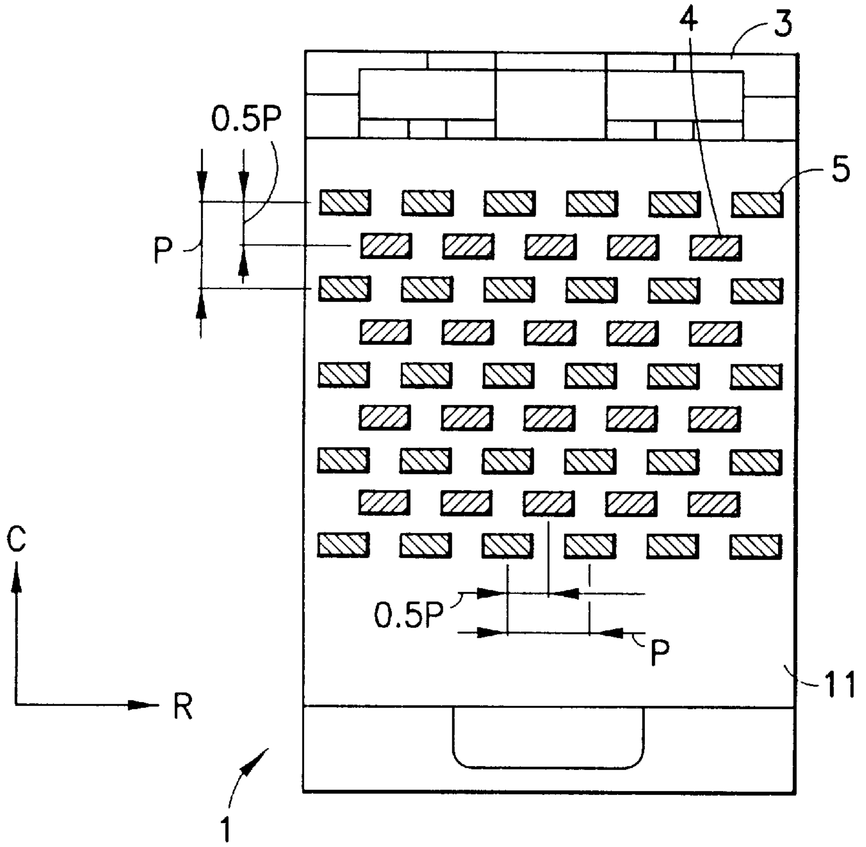
FIG. 3 is a top view of the male connector of the connector assembly of FIG. 1.
Figure 4:
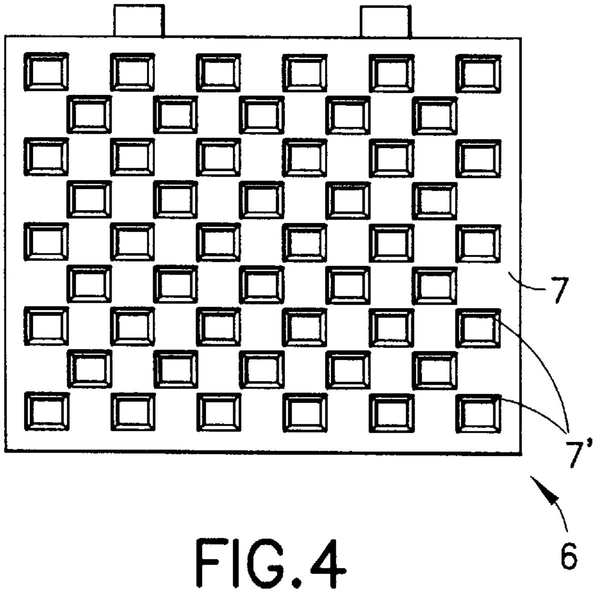
FIG. 4 is a front view of the female connector of the connector assembly of FIG. 1.
Figure 5:
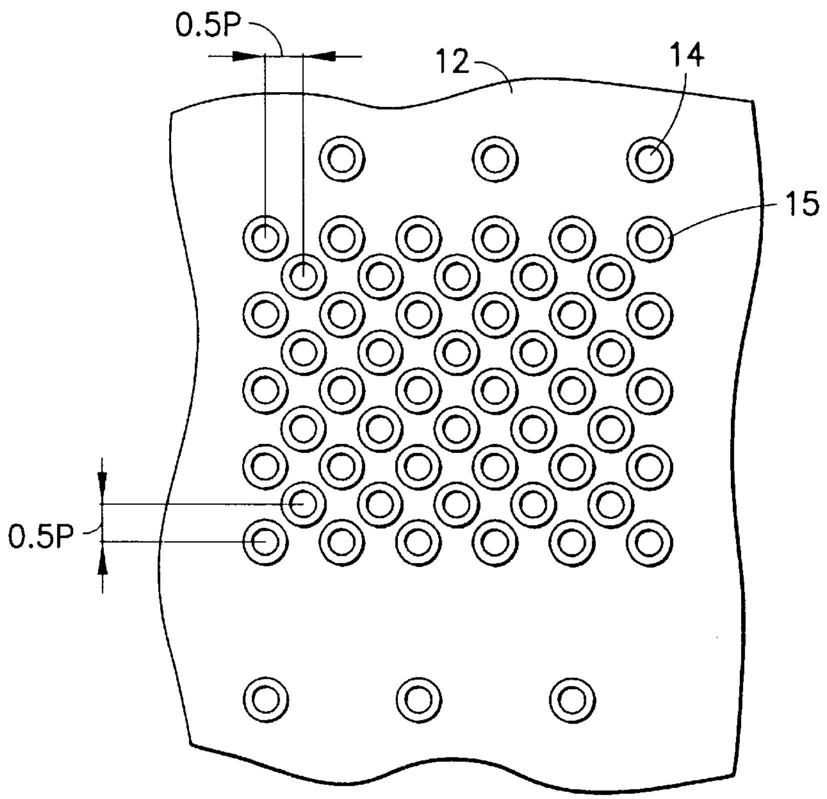
FIGS. 5 and 6 show the layout of a printed circuit board for the male and female connectors of the connector assembly of FIG. 1.
Figure 6:
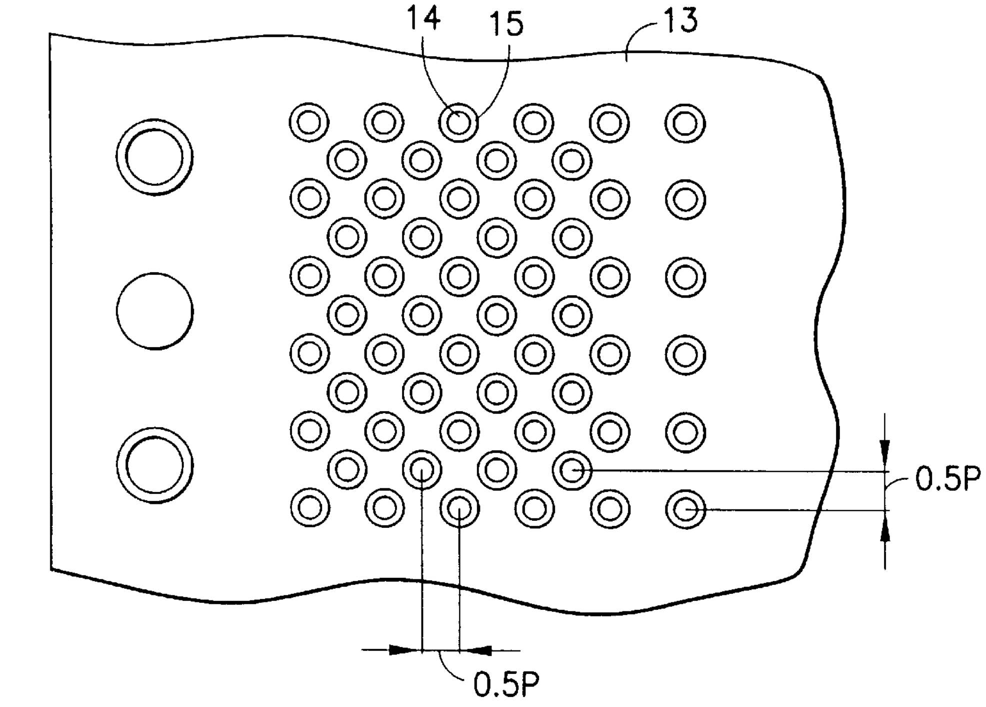

In order to increase the density of contacts, the signal and ground contacts 4, 5 and 9, 10 are arranged in a special manner as can be seen in FIGS. 3–6 in particular. FIG. 3 is a top view of the male connector 1 wherein the signal and ground contacts 4, 5 are indicated by a different shading wherein the dimensions of the contacts 4, 5 are shown at the height of a bottom 11 of the housing 3. FIGS. 5 and 6 show by way of example the layout of a printed circuit board 12 for the male connector 1 and 13 for the female connector 2, respectively. The printed circuit board 13 for the female connector 2 is also schematically shown in FIGS. 1 and 2. From these drawings it will be clear that all contacts are regularly arranged in rows r and columns c, wherein in each row and column all contacts 4, 5 and 9, 10 are arranged at an equal pitch p in row and column direction. This pitch p can be 2 mm, for example. Further, each row and each column of signal contacts 4 or 9 contains signal contacts only and each row and each column of ground contacts 5 or 10 contains ground contacts only. As can be seen especially in FIG. 3, successive rows of contacts 4, 5 are staggered in row direction by half the pitch p of the contacts, wherein the rows and columns of contacts have a pitch equal to half the pitch p of the contacts. In this manner a pitch ½p of the contacts 4, 5 and 9, 10 in adjacent rows and columns can be obtained. At a pitch=2 mm, the pitch between adjacent contacts 4, 5 and 9, 11 will be 1 mm. This pitch ½p can be less than half the dimension of the male contacts 4, 5 in row direction at the location of the bottom 11 of the male housing 3, so that the contacts can be arranged at a smaller pitch than the dimensions of the male contacts would allow at a conventional arrangement. Further, FIGS. 5 and 6 show that the density of the contacts can be increased such that the pitch ½p in row and column direction between the holes 14 in the printed circuit boards 12, 13 can be equal or even less than the diameter of the plated area 15 around each of the holes 14.

Preferably the outer rows and outer columns of contacts are ground contacts as shown in FIG. 3.

As shown in FIG. 4 in a front view of the front housing 7 the female connector 2, the entrance openings 7' for the male contacts 4, 5 can have dimensions at the entrance side which are almost equal or even greater than the pitch between the contacts of adjacent rows and columns.

In the embodiment of the connector assembly of FIGS. 1–6, all male and female contacts are provided with press-fit terminations 16 for connection to the plated through-holes 14 of the corresponding printed circuit boards 12, 13. In the female connector 2, the rear housing 8 is provided with support shoulders 17 cooperating with rear sections 18 of the female signal and ground contacts 9, 10. These rear sections 18 are provided with two bends of approximately 45°, wherein the shoulder 17 is located at the first bend as seen from the press-fit termination 16. In the embodiment of FIGS. 1–6, the rear sections 18 are provided with recesses 18' for engaging the shoulders 17. In this manner the forces applied to the rear sections 18 of the female contacts 9, 10 are exerted on the shoulders 17 of the rear housing 8 so that no deformation of the female contacts 9, 10 can occur during insertion of the press-fit terminations 16 into the through-holes 14 of the printed circuit board 13.

Figure 1:
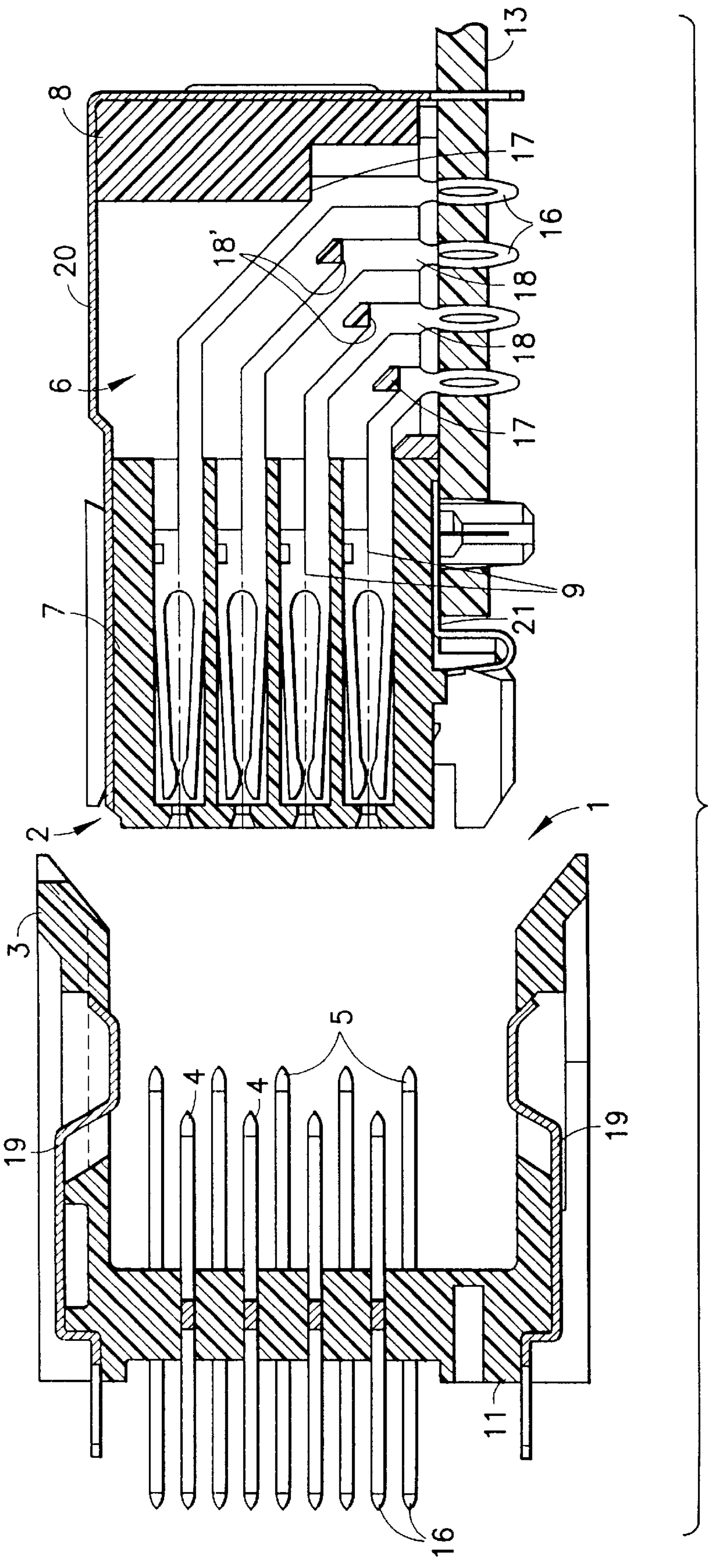
FIG. 1 shows a cross-section through a column of signal contacts of a connector assembly according to the invention, wherein the connectors are disconnected.

In the embodiment shown in FIGS. 1 and 2, the male connector 1 is provided with shielding plates 19 and the female connector 2 is provided with an upper shielding plate 20 and a lower shielding plate 21. The upper shielding plate 20 provides for the mutual fixation of the front and rear housings 7, 8.

Figure 8:
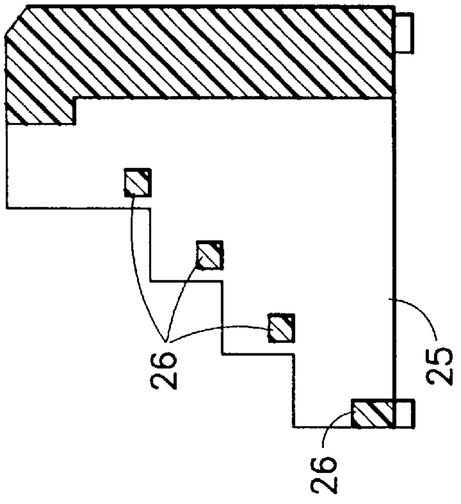
FIG. 8 shows a cross-section of the rear housing of the female connector of FIG. 7.
Figure 7:
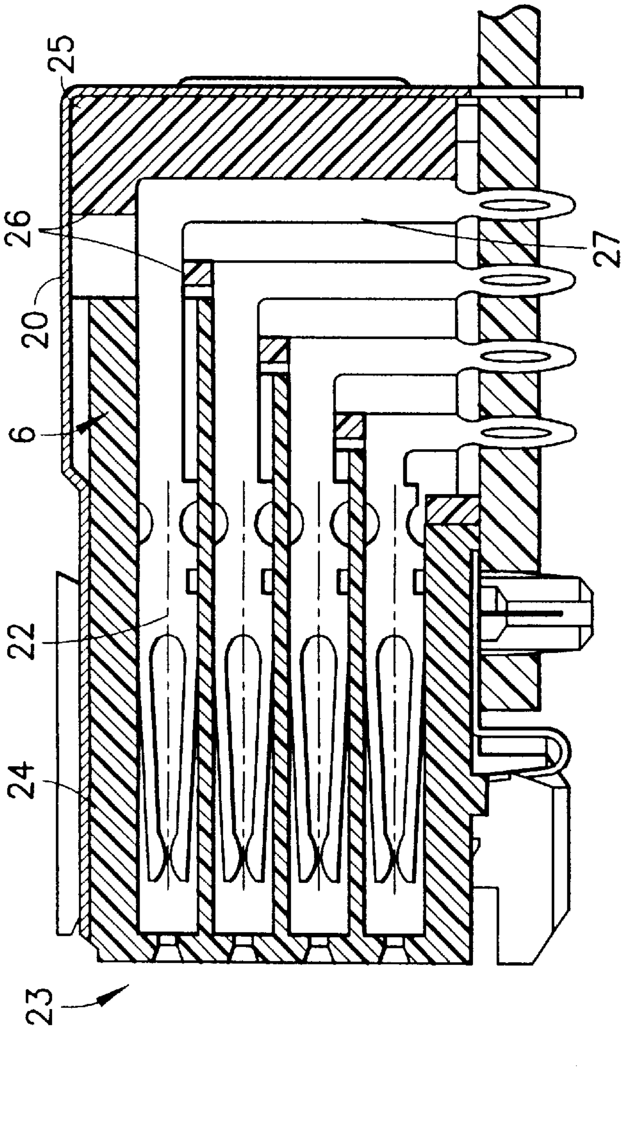
FIG. 7 shows a cross-section through a column of signal contacts of a second embodiment of the female connector.

FIG. 7 shows a cross-section through a column of signal contacts 22 of a female connector 23 which is made mainly in the same manner as the female connector 2 of FIGS. 1–4. In this case the female signal and ground contacts, of which only the signal contacts 22 are shown in FIG. 7, are provided with one bend of 90° only. The housing 6 of the connector 23 comprises a front housing 24 and a rear housing 25, the rear housing 25 being shown in FIG. 8 in cross-section. In the same manner as the rear housing 8, the rear housing 25 is provided with support shoulders 26 engaging rear sections 27 of the female contacts 22. In this embodiment these rear sections 27 have one bend of 90° and the shoulder is located at this bend. The rear sections 27 are not provided with any recesses. It will be understood that in the connector 23, the forces exerted on the female contacts 22 during insertion into the through-holes 14 of a printed circuit board cannot cause any deformation of the female contacts as these forces are exerted on the shoulders 26.

In the same manner as in the embodiment of FIGS. 1–4, an upper shielding plate 20 provides for the mutual fixation of the front and rear housings 24, 25.

It will be understood that the female connector 23 can be combined with the male connector 1 of FIGS. 1 and 3. Further it is noted that the front view of the female connector 23 corresponds with the front view shown in FIG. 4. Of course the layout of the printed circuit board of FIG. 6 is also used for the female connector 23.

Figure 9:
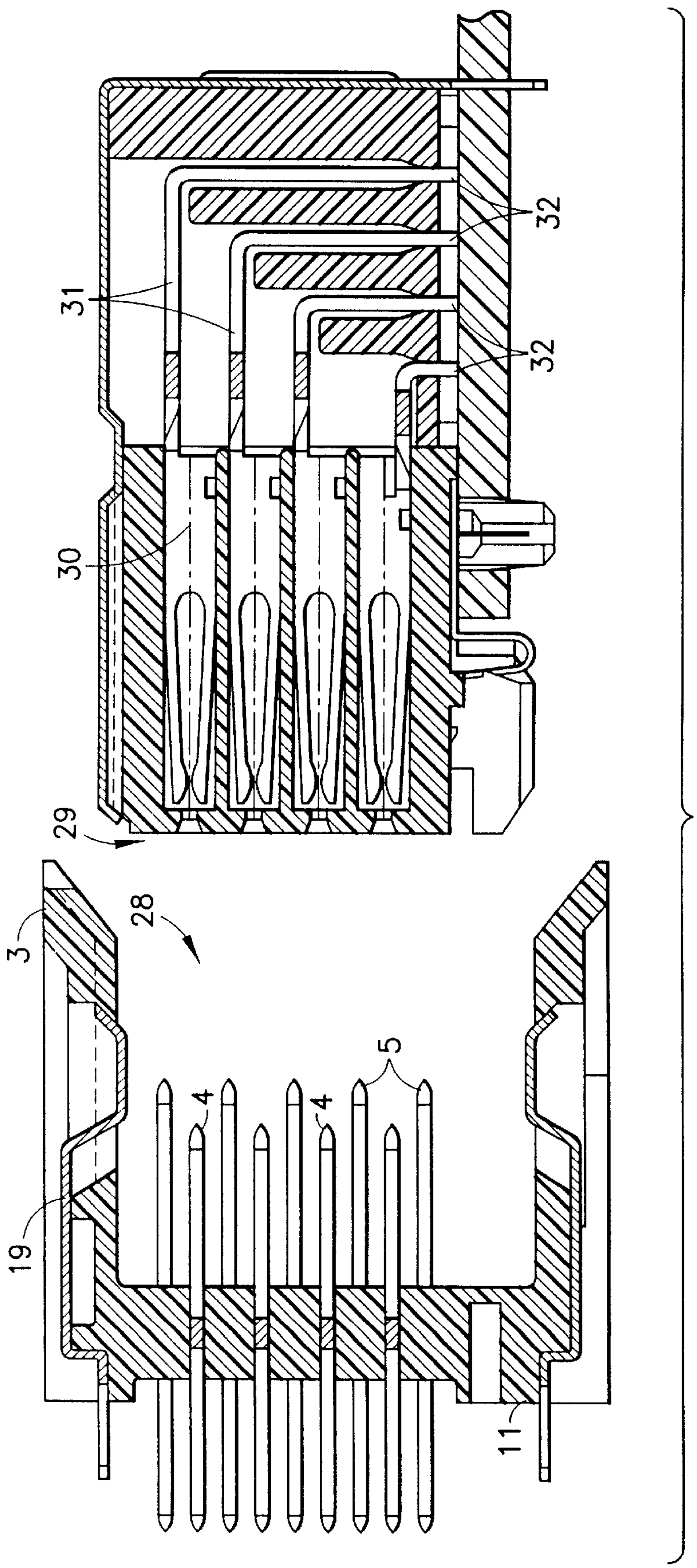
FIGS. 9 and 10 show cross-sections through a column of signal and ground contacts, respectively of a third embodiment of the connector assembly according to the invention, wherein the connectors are disconnected.
Figure 10:
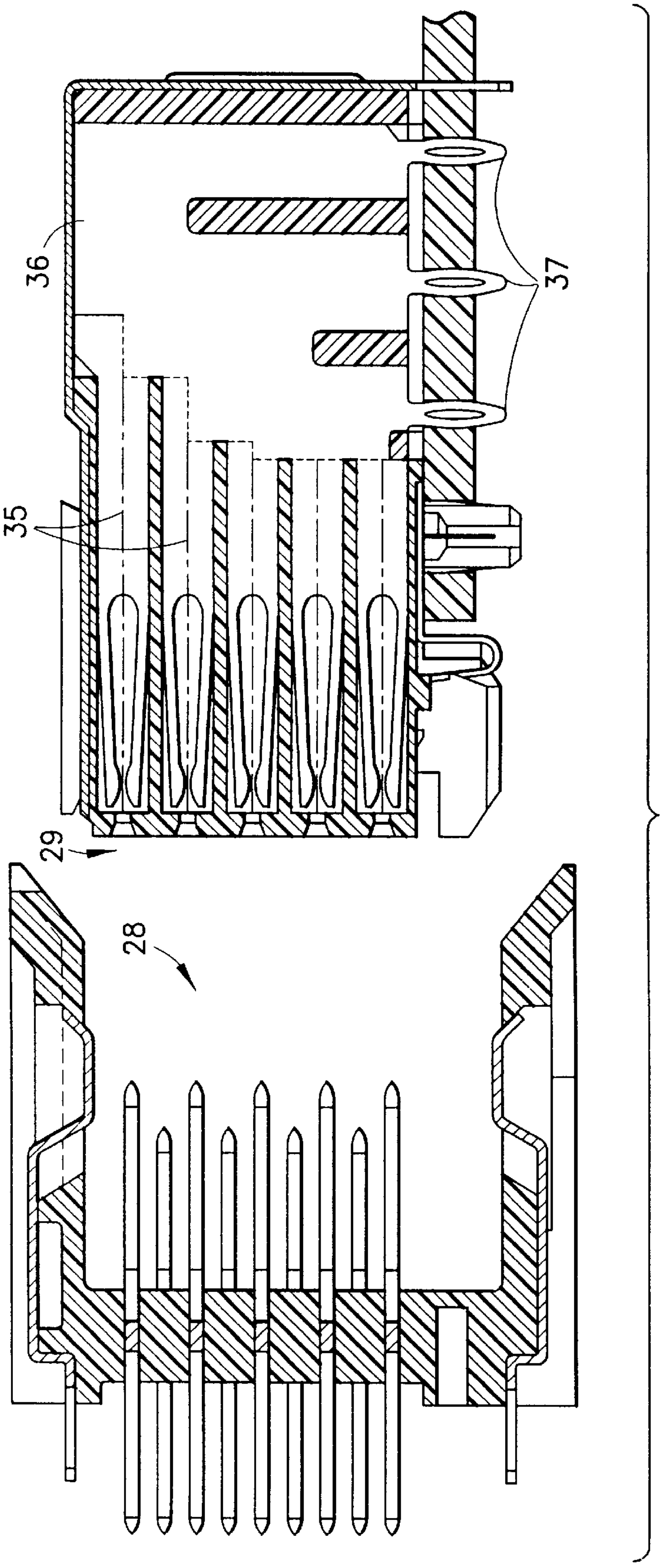
Figure 11:
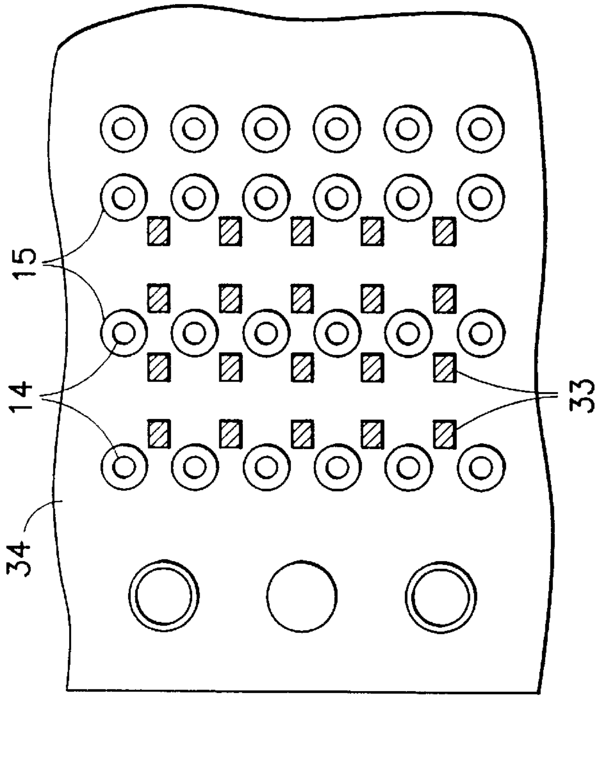
FIG. 11 shows a layout of a printed circuit board for the female connector of the connector assembly of FIGS. 9 and 10.

FIGS. 9 and 10 show cross-sections through a column of signal and ground contacts, respectively, of a connector assembly comprising a male connector 28 and a female connector 29. The male connector 28 corresponds with the male connector 1 and corresponding parts are indicated by the same reference numerals. In the female connector 29, the female signal contacts 30 are provided with rear sections 31, each rear section operating as a spring and carrying a pressure contact termination 32 adapted to contact a contact pad 33 of a printed circuit board 34 partially shown in FIG. 11. The female ground contacts 35 of one column are an integral part of a female contact element 36 provided with a plurality of press-fit terminations 37. The male and female contacts are arranged in staggered rows and columns in exactly the same manner as in the connector assembly of FIGS. 1 and 2. It will be understood that the front view of the female connector 29 corresponds with the front view of FIG. 4.

As the rear sections 31 of the female signal contacts 30 have a varying length depending on the location of the contact in the connector, the spring force exerted by the pressure termination contact 32 on the contact pads 33 will also vary. This varying spring force can be advantageous to overcome mounting tolerances in mounting the female connector 29 on the printed circuit board 34.

FIG. 12 shows an embodiment of a female connector 38 in cross-section through a column of signal contacts 39. This female connector can be combined with the male connector 1 or 28. It will be clear that the front view of the female connector 38 corresponds with the front view of FIG. 4. Each of the signal contacts 39 of the female connector 38 comprises a rear section 39' having a fork-shaped part 40. This fork-shaped part 40 has a first leg 401 operating as a spring section and a second leg 402 operating as a mounting section. The spring section 401 has the same length for all signal contacts 39 and carries a pressure contact termination 41 of the signal contact 39. In this manner the spring force exerted by a pressure contact termination 41 is the same for all signal contacts 39. The value of the spring force can be determined by means of the length of the spring section 401. Of course it is also possible to provide contacts with spring sections with different lengths to vary the spring force in a predetermined manner. The mounting section 402 engages a shoulder 402' of the rear housing 8.

The female ground contacts 35 (not shown in FIG. 12) of a column of the connector 38 are integral with a ground contact element 36 in the same manner as in the embodiment of FIG. 9 and 10. It is noted that the layout of the printed circuit board 34 of FIG. 11 can also be used for the female connector 38.

By way of example the connection of the pressure contact terminations 41 of the signal contacts 39 to the contact pads 33 of the printed circuit board 34 is shown in detail in FIGS. 20A–20C. As shown in these figures the pressure contact terminations 41 have a flattened lower surface which is pressed on the corresponding contact pad 33 of the printed circuit board 34. In the view of FIGS. 20A and 20B the pressure contact terminations 41 are slightly curved whereas in the view of FIG. 20C perpendicular to the view of FIG. 20B the terminations are substantially flat.

Although in the embodiments of FIGS. 9, 10 and 12 the male connector 28 is provided with male signal and ground contacts having press-fit terminations, the male signal contacts can also be provided with pressure contact terminations. An example of a row of male signal contacts 42 with pressure contact terminations 43 is shown in FIG. 18. Each of the male signal contacts 42 is provided with a front or contact pin section 44 for contacting a corresponding female contact and a rear section carrying the pressure contact termination 43. Each male signal contact 42 has a mounting section 45 extending transverse to the contact pin section 44. This mounting section 45 is received in a slot 46 in the bottom 11 of the housing 3. The pressure contact termination 43 is made as a mainly U-shaped part, having one leg joining the rear section and a free leg having a contact extension 47. This contact extension 47 is substantially aligned with the axis of the contact pin section 44. This contact extension 47 is adapted to contact a contact pad of a printed circuit board, such as the contact pads 33 shown in FIG. 11.

All free legs of the U-shaped pressure contact terminations 43 are located in a space 48 between the lower side of the bottom 11 of the housing 3 and the surface of a printed circuit board. This space 48 is obtained by providing the lower side of the bottom 11 with a recess 50.

FIG. 19 shows a further embodiment of a male signal contact 51 provided with a pressure contact termination 52 which is mainly L-shaped. One leg of this contact termination 52 is provided with a contact extension 47 substantially aligned with the axis of the contact pin section 44. The other leg of the L-shaped pressure contact termination 52 extends mainly parallel to the rear section of the contact 51 and joins a mounting section 53. This mounting section 53 is received in a slot 46 in the bottom 11 of the housing 3 in the same manner as the mounting section 45 of the signal contact 42 of FIG. 18.

It is noted that providing the signal contacts of one or both connectors with pressure contact terminations in combination with ground contacts having press-fit terminations shows the advantage that the signal contacts are shielded so that radiation from the signal contacts is avoided.

Figure 13:
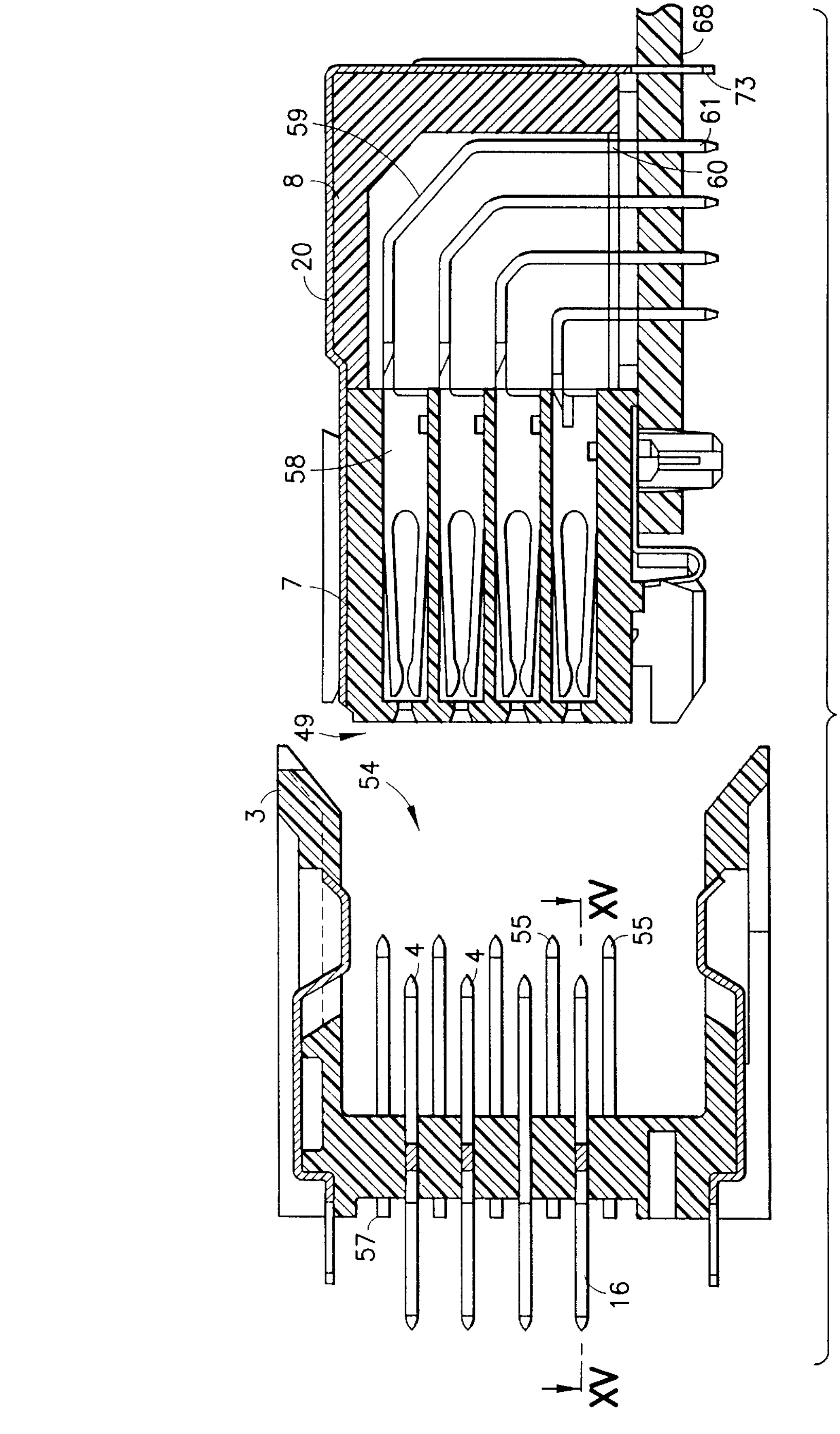
FIGS. 13 and 14 show cross-sections through a column of signal and ground contacts, respectively of a fifth embodiment of the connector assembly according to the invention, wherein the connectors are disconnected.
Figure 14:
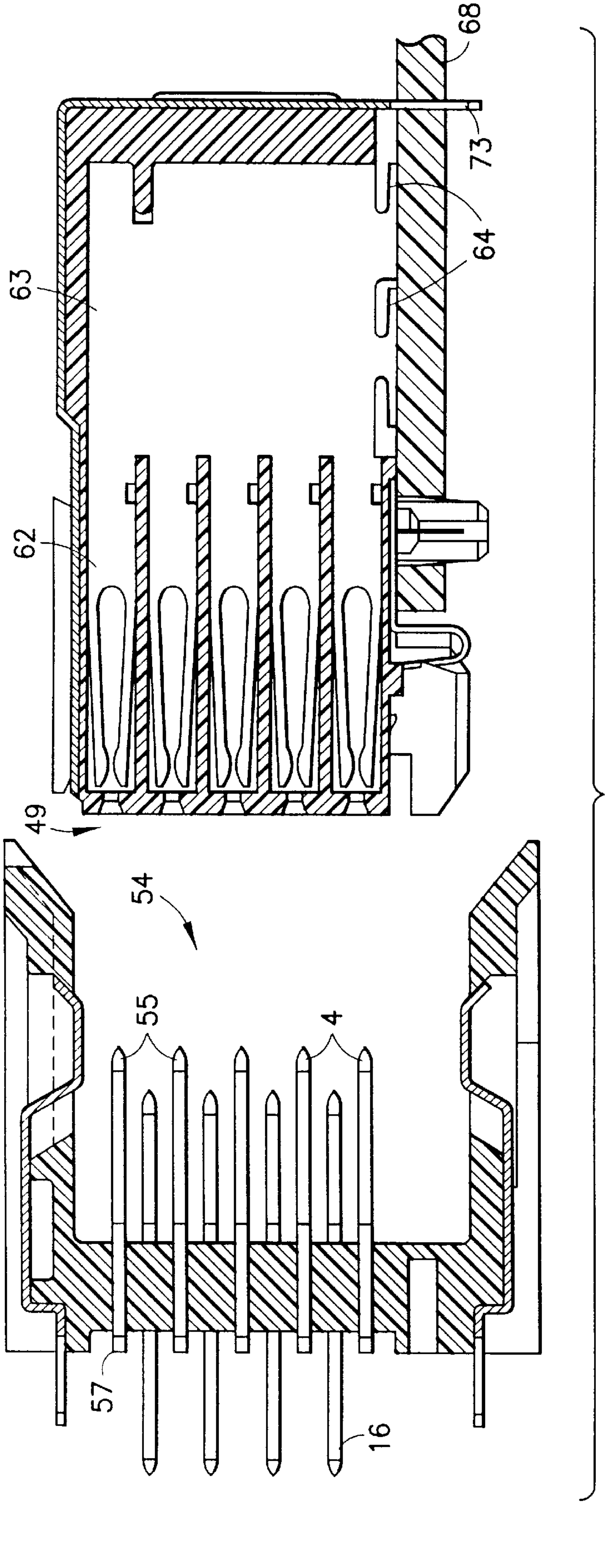
Figure 15:
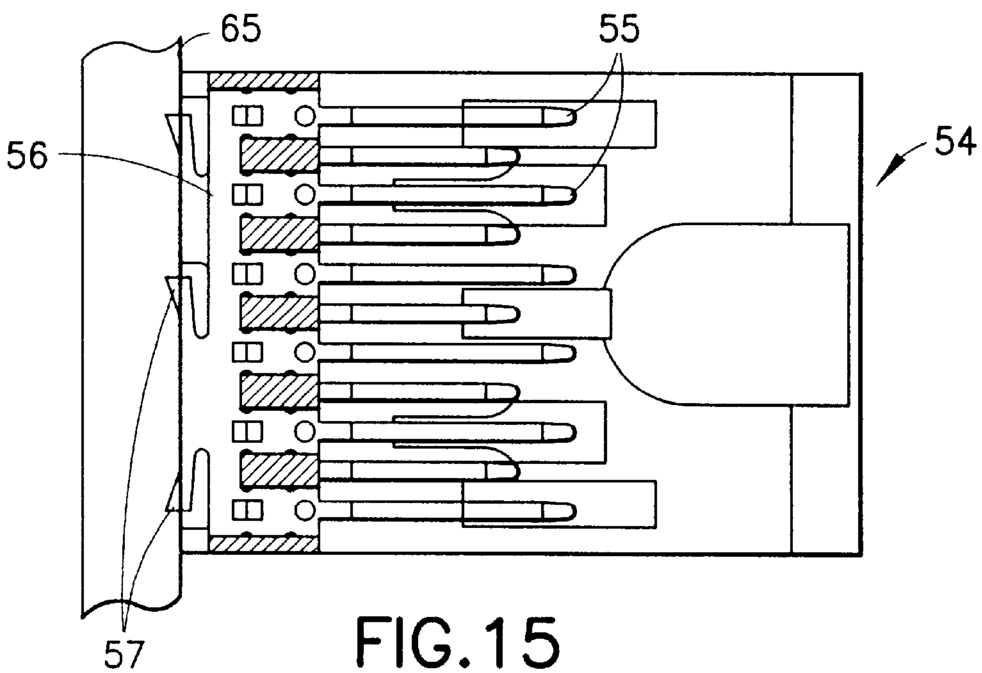
FIG. 15 shows a section of the male connector according to the line XV—XV in FIG. 13.

Referring to FIGS. 13 and 14 there is shown a connector assembly in cross-section through a column of signal and ground contacts, respectively, the connector assembly comprising a male connector 54 and a female connector 49. In this case the male connector 54 is provided with the same signal contacts 4 as the male connector 1, whereas male ground contacts 55 are interconnected by a strip 56 as shown in the section of FIG. 15. The male ground contacts 55 of one row are connected to the printed circuit board through pressure contact terminations 57 integrally formed with the strip 56. It is noted that it is also possible to use the male contacts 42 or 51 as shown in FIGS. 18 and 19 as male ground contacts.

As shown in FIG. 13, the female signal contacts 58 are provided with rear sections 59 having shoulders 60 and press-fit terminations 61. The shoulders 60 are cooperating wih the lower side of the rear housing 8 of the female connector 49 to receive insertion forces in order to prevent deformation of the signal contacts. As an alternative for the shoulders 60 the rear housing 8 can be provided with support shoulders to receive insertion forces in order to prevent deformation of the signal contacts.

In FIG. 14 a cross-section through a column of female ground contacts 62 is shown and as indicated these ground contacts 62 are integral parts of a female ground contact element 63 having pressure contact terminations 64.

The embodiment of FIGS. 13 and 14 shows the advantage that the ground contact elements 55–57 and 63 can be provided with pressure contact terminations with sufficient pressure force in an easier manner than the signal contacts in the embodiments of FIGS. 9, 10 and 12.

Figure 16:
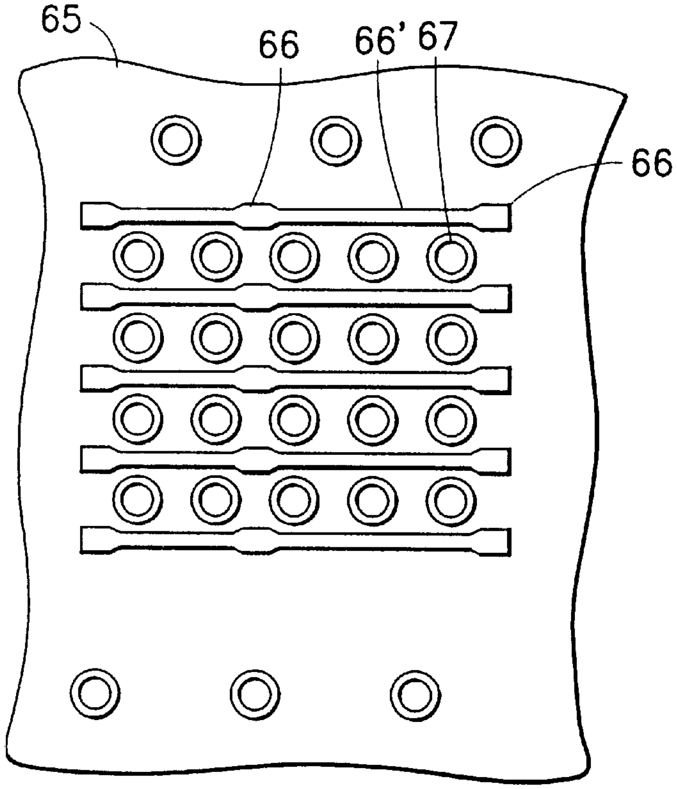
FIGS. 16 and 17 show by way of example the layout of a printed circuit board for the male and female connectors of FIGS. 13 and 14.

As schematically shown in FIG. 15 the male connector 54 is mounted on a printed circuit board 65. A layout for this printed circuit board 65 is shown in FIG. 16. FIG. 16 clearly shows contact pads 66 contacted by the pressure contact terminations 57 of the male ground contacts 55. These contact pads 66 are in this case interconnected by circuit parts 66'. The contact pads 66 are staggered in row direction with respect to through-holes 67 for the pressure fit terminations 16 of the male signal contacts 4.

Figure 17:
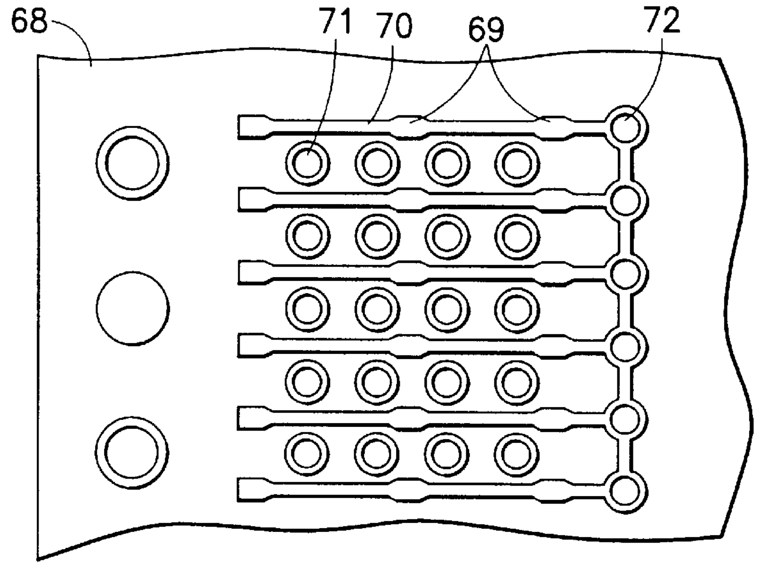

A corresponding layout for a printed circuit board 68 is shown in FIG. 17. This printed circuit board 68 is provided with contact pads 69 for the pressure contact terminations 64 of the female ground contact elements 63. These contact pads 69 interconnected by circuit parts 70 are staggered in row direction with respect to through-holes 71 for the press-fit terminations 60 of the female signal contacts 58. In this embodiment the ground contact pads 69 are also connected to ground through-holes 72 in which press-fit terminations 73 of the upper shielding plate 20 are inserted. As in the other embodiments this upper shielding plate 20 provides for a mutual fixation of the front and rear housings 7, 8 of the female connector.

FIGS. 21A–21C show details of a further embodiment of a female connector 74 mainly corresponding with the female connector 38 shown in FIGS. 12 and 20A–20C so that this connector 74 will not be explained in detail. Corresponding parts are indicated by the same reference numerals. In this case the spring sections 401 of the signal contacts 39 carry a pressure contact termination 75 with a contact end having a radius larger than the radius of the plated through-holes 14 of the printed circuit board 76. In this manner the pressure contact terminations 75 are adapted to contact a printed circuit board 76 having conventional through-holes 14. Thereby it is not necessary to provide special contact pads 33 as in the above-described embodiments of the connector with pressure contact terminations. As shown in FIGS. 21B and 21C, the radius of the contact end of the pressure contact terminations 75 is larger than the radius of a through hole 14 in one direction only (FIG. 21B) whereas in the direction perpendicular to the view of FIG. 21B the width of the pressure contact termination 75 is smaller than the diameter of a through hole 14 (FIG. 20C). It is noted that the same type of pressure contact terminations 75 can be used in the embodiment of the connector assembly shown in FIGS. 9, 10. Further, the same type of connection between pressure contact terminations and plated through-holes can be used in the embodiments of male contacts shown in FIGS. 18 and 19 provided that the same type of rounded contact end is used.

It will be understood that the invention is not restricted to the above-described embodiments which can be varied in a number of ways within the scope of the claims.

What is claimed is:

1. Connector for printed circuit boards with a high density of contacts, comprising a housing of insulating material and a plurality of signal and ground contacts regularly arranged in rows and columns, wherein at least a plurality of said signal and ground contacts are provided with press-fit terminations for connection to the printed circuit board, characterized in that the housing is provided with shoulders, each of the shoulders cooperating with a contact rear section of one of said signal and ground contacts having the press-fit termination, wherein when the contacts are inserted with the housing each shoulder engages one of the contact rear sections at a location aligned with the corresponding press-fit termination.

2. Connector according to claim 1, wherein each contact rear section cooperating with a corresponding shoulder is provided with a recess engaging said shoulder.

3. Connector according to claim 2, wherein each contact rear section cooperating with a corresponding shoulder is provided with a first bend and a second bend, wherein the corresponding shoulder is located at the first bend as seen from the corresponding press-fit termination.

4. Connector according to claim 2, wherein each contact rear section cooperating with a corresponding shoulder is provided with a bend, wherein the corresponding shoulder is locate at said bend.

5. Connector according to claim 1, wherein a plurality of the signal and/or ground contacts are provided with pressure contact terminations for connection to the corresponding printed circuit board, wherein the remaining contacts are provided with press-fit terminations for connection to the corresponding printed circuit board.

6. Connector according to claim 1, wherein in each row and each column all contacts are arranged at an equal pitch in row and column direction, in that successive rows of contacts are staggered in row direction by half the pitch of the contacts, wherein each row and each column of contacts contains only signal or only ground contacts, respectively, and wherein the rows and columns of contacts have a pitch equal to half the pitch of the contacts.

7. A connector according to claim 3 wherein the first bend and the second bend each has an angle of approximately 45°.

8. A connector according to claim 4 wherein the bend has an angle of approximately 90°.

9. A connector according to claim 1 wherein the housing comprises a front portion and a rear portion, the rear portion adapted to be joined to the front portion with the contact pins disposed therein, the rear portion of the housing including the shoulders, wherein when the rear portion is joined to the front portion the shoulders are caused to engage the contact rear section at the point aligned with the corresponding press-fit termination.

10. The connector of claim 9 further comprising a plate adapted to fixedly join the front portion to the rear portion.

11. The connector of claim 10 wherein the plate is a shielding plate.

12. A connector assembly for a printed circuit board comprising:

a housing comprising a front section and a rear section;

a plurality of contacts disposed within said housing, the contacts being arranged in alternating rows of a plurality of signal contacts and a plurality of ground contacts;

a press-fit termination at an end of each contact, the press-fit termination adapted for connection to a plated through-hole in the printed circuit board;

at least one bend in a rear section of each contact at a point above the press-fit termination, the bend adapted to align a front section of each contact opposite the press-fit termination in a direction toward a corresponding entrance opening in the front section of the housing;

a recess on the rear section of each contact, wherein the recess is in line with the press-fit termination and on an opposed side of the bend; and a plurality of shoulders disposed within the rear portion of the housing, each shoulder adapted to engage the recess on the rear section of a corresponding contact when the rear portion of the housing is caused to be joined with the front portion of the housing as an assembly, the shoulders being adapted to receive a force applied to the contact when the press-fit termination is inserted in the plated through-hole on the printed circuit board and prevent the contact pin from deforming.

13. The connector of claim 12 wherein the at least one bend comprises a first bend and a second bend, the first bend located near a top portion of the press-fit termination and adapted to direct the contact away from the press-fit termination and towards the entrance opening, the second bend located away from the first bend and adapted to direct the front end of the contact into the entrance opening.

14. The connector of claim 12 wherein the at least one bend has an angle of about 45°.

15. The connector of claim 12 wherein the recess comprises a top portion of the press-fit termination along the rear section of the contact having a surface area sufficient to cooperate with the corresponding shoulder.

16. The connector of claim 12 wherein the rear section of the contact extends away from the press-fit termination at an angle of about 45° towards the entrance opening and is adjacent to a top portion of the press-fit termination.

17. The connector of claim 12 wherein a top portion of the press-fit termination forms an obtuse angle with the rear section of the contact.

18. The connector of claim 12 wherein the at least one bend has an angle of about 90°.

19. The connector of claim 18 wherein the shoulder engages a top portion of the contact at the bend.

* * * * *